(12) United States Patent
Ramakrishna et al.

(10) Patent No.: US 8,581,375 B2
(45) Date of Patent: Nov. 12, 2013

(54) LEADFRAME-BASED MOLD ARRAY PACKAGE HEAT SPREADER AND FABRICATION METHOD THEREFOR

(75) Inventors: Kambhampati Ramakrishna, Chandler, AZ (US); Diane Sahakian, Tempe, AZ (US); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/492,765

(22) Filed: Jun. 8, 2012

(65) Prior Publication Data

US 2012/0241929 A1     Sep. 27, 2012

Related U.S. Application Data

(62) Division of application No. 10/921,376, filed on Aug. 18, 2004, now Pat. No. 8,211,753.

(60) Provisional application No. 60/498,037, filed on Aug. 26, 2003.

(51) Int. Cl.
*H01L 23/495* (2006.01)

(52) U.S. Cl.
USPC ............ 257/675; 257/E23.051; 257/E23.031; 257/E23.092; 257/E23.087

(58) Field of Classification Search
USPC ........... 257/675, E23.092, E23.087, E23.051, 257/E23.031
See application file for complete search history.

(56) References Cited

U.S. PATENT DOCUMENTS

| | | | |
|---|---|---|---|
| 6,242,281 B1* | 6/2001 | Mclellan et al. | 438/106 |
| 6,432,749 B1* | 8/2002 | Libres | 438/122 |
| 6,448,107 B1* | 9/2002 | Hong et al. | 438/106 |
| 6,775,140 B2* | 8/2004 | Shim et al. | 361/704 |
| 7,259,445 B2* | 8/2007 | Lau et al. | 257/675 |

\* cited by examiner

*Primary Examiner* — Colleen Matthews
(74) *Attorney, Agent, or Firm* — Ishimaru & Associates LLP

(57) ABSTRACT

A heat spreader frame is provided including: heat spreaders having upper surfaces; a peripheral frame surrounding the heat spreaders; spreaders, the peripheral frame having stand-off legs; tie bars having upper surfaces and a pin identifier at an end portion of the tie bars, the heat spreaders connected to one another and to the peripheral frame by the tie bars, the width of the stand-off legs wider than widths of the tie bars; at least portions of the upper surfaces of the tie bars being thinned to reduce heights of the tie bars; the upper surfaces of the heat spreader in an elevated position supported by the peripheral frame; and the heat spreaders and the tie bars covered by an package molding compound exposing the upper surface of the heat spreaders and one surface of the pin identifier coplanar to the upper surfaces of the heat spreaders.

11 Claims, 4 Drawing Sheets

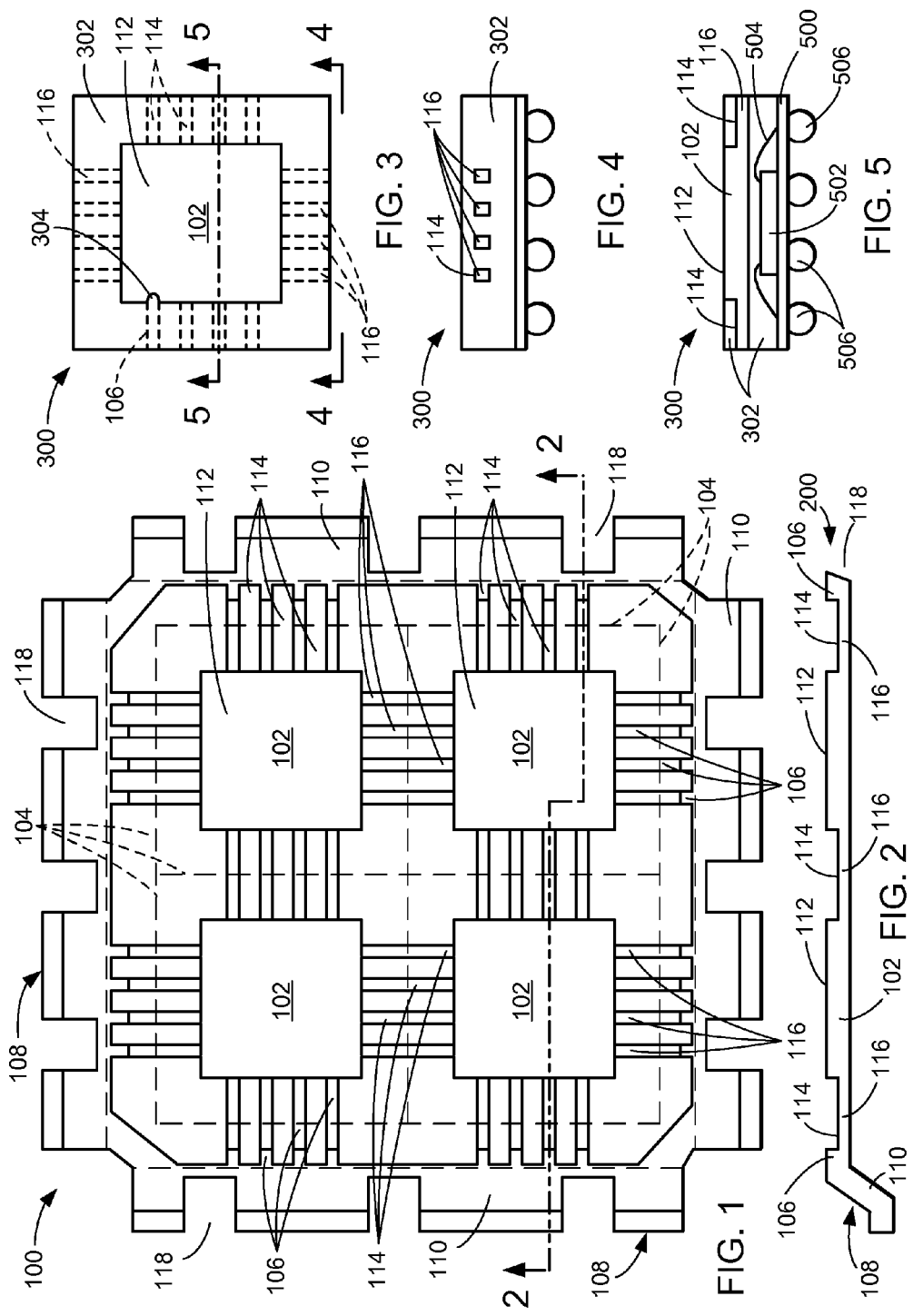

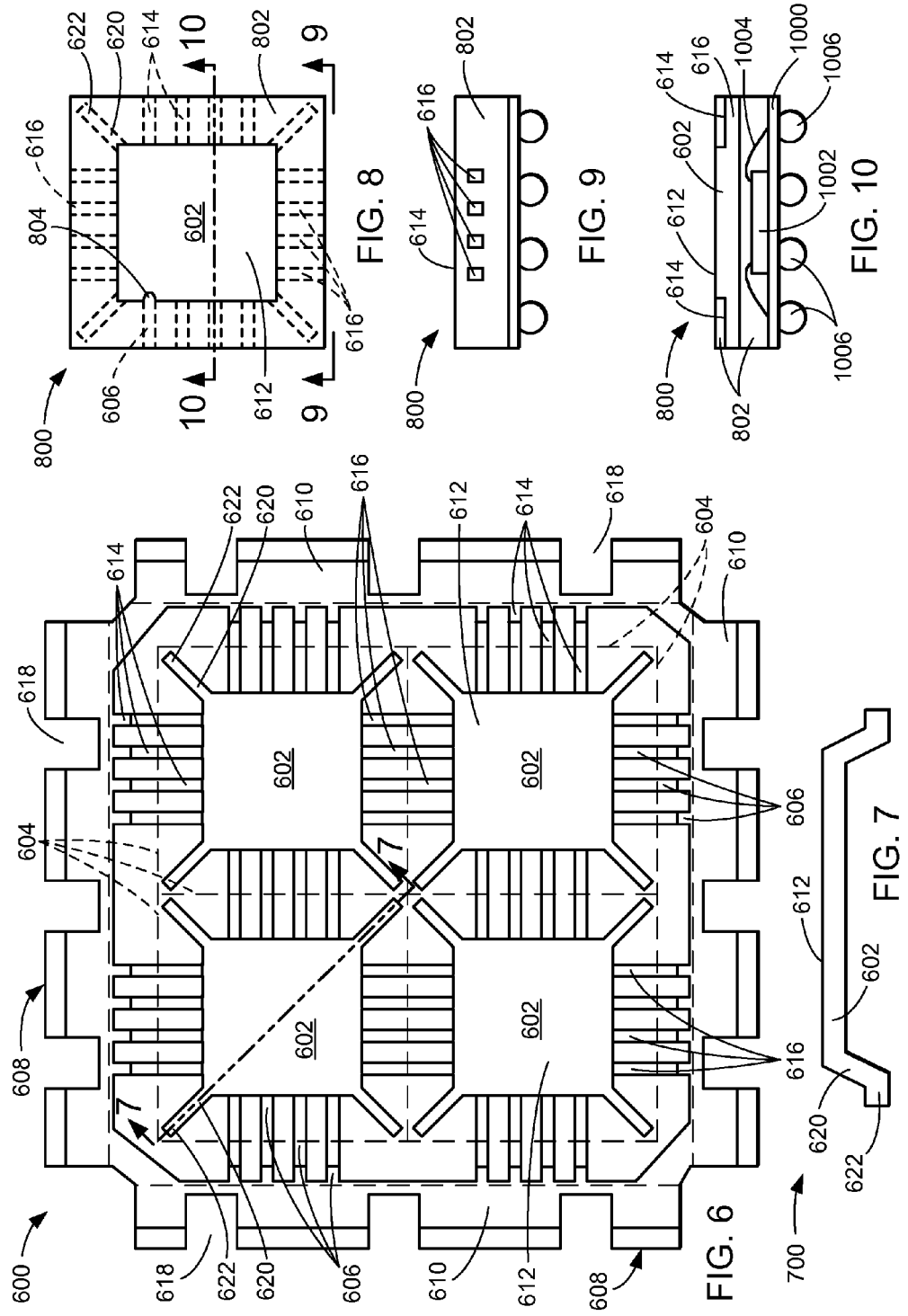

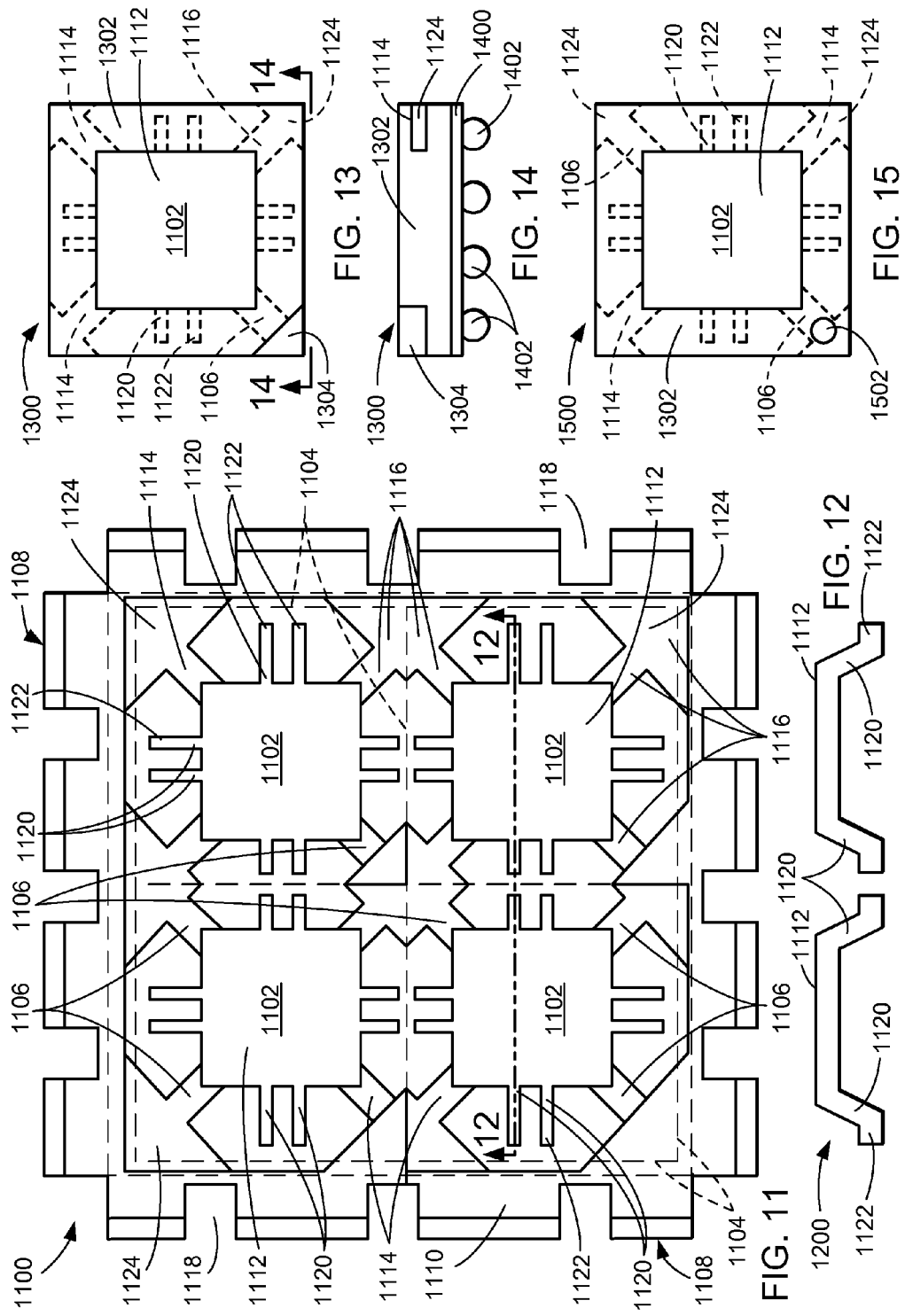

LEADFRAME-BASED MOLD ARRAY PACKAGE HEAT SPREADER AND FABRICATION METHOD THEREFOR

CROSS-REFERENCE TO RELATED APPLICATION(S)

This application is a divisional of co-pending U.S. patent application Ser. No. 10/921,376 filed Aug. 18, 2004.

This application claims the benefit of U.S. Provisional Patent Application Ser. No. 60/498,037 filed Aug. 26, 2003, and the subject matter thereof is hereby incorporated herein by reference thereto.

TECHNICAL FIELD

The present invention relates generally to semiconductor heat dissipation, and more particularly to semiconductor integrated circuit package heat spreaders and methods for the fabrication thereof.

BACKGROUND ART

In the electronics industry, a continuing objective is to further and further reduce the size of electronic devices while simultaneously increasing performance and speed. To accomplish this, increased miniaturization of integrated circuit ("IC") packages for these devices is becoming increasingly essential. Cellular telephones, personal data devices, notebook computers, portable music players, camcorders, and digital cameras are but a few of the consumer products that require and benefit from this ongoing miniaturization of sophisticated electronics.

IC assemblies for such complex electronic systems typically have a large number of interconnected IC chips, or dies. The IC dies are usually made from a semiconductor material such as silicon (Si) or gallium arsenide (GaAs). During manufacture, the several semiconductor devices on the IC dies are formed on the dies in various layers using photolithographic techniques.

After manufacture, the IC dies are typically incorporated into IC packages that may contain one or several such dies. Typically, a die is mounted on the surface of a substrate by a layer of epoxy, and electrical contact pads on the upper surface of the die are then connected to the substrate by gold bond wires. In lieu of contact pads used for gold bond wires, solder balls can also be provided on the upper (i.e., active) surface of the die for connections between the die and the substrate; in which case the active surface of the die is face down. A molding compound then encapsulates the die and the bond wires, providing environmental protection and defining the semiconductor IC package. These IC packages, or modules, are then typically mounted on printed circuit boards.

Heat management through such an IC package structure can be critical. The internal thermal resistance and thermal performance of the packaged die are determined by a series of heat flow paths. By making high heat conductivity connections between the bottom of the die and the package substrate, the heat generated by the die can be transferred efficiently from the die to the substrate and then out of the IC package. Often, however, the amount of heat generated in the die is more than can be efficiently transferred in this manner, thus requiring the attachment of a heat spreader to the top of the IC package.

With the ever-decreasing sizes of electronic devices, die-sized IC packages have been developed in which the dimensions of the IC package are almost the same as those of the semiconductor die that is encapsulated inside the IC package. With dimensions so small, it is very difficult to cost-effectively mount die-sized heat spreaders on die-sized IC packages. As a result, some IC packages are mounted on circuit boards without a heat spreader. This may reduce the overall manufacturing and assembly costs, but it increases the risk of making the encapsulated semiconductor die prone to temperature-related damage and lower operating efficiency.

It is similarly difficult and expensive to pre-attach external individual heat spreaders to such small, die-sized IC packages in the factory, or to embed individual heat spreaders into the IC packages themselves as they are being manufactured, where such individual heat spreaders are each made for each package. Mounting a die-sized heat spreader accurately onto an IC package is a process that requires high mounting precision, which adversely increases overall packaging time and costs. Likewise, it is very difficult to control and maintain the precise alignment required to position a heat spreader for embedding within an IC package during encapsulation while the package is being manufactured.

These problems are made even worse by modern, high-performance package configurations. For example, in an effort to improve heat conduction downwardly to the motherboard, high thermal conductivity ("high-k") epoxy molding compounds ("EMCs") and multi-layer substrates have been used. However, high-k EMCs are expensive and difficult to process. Moreover, their high filler content increases stresses in the IC packages and on the die surfaces. Multi-layer substrates are also expensive, and they remove heat only through the motherboard. Therefore, external heat spreaders may still be needed, especially for a motherboard that has several heat-generating IC packages thereon.

Thus, a need remains for economical, readily manufacturable heat spreaders for small, die-sized IC packages, and particularly for heat spreaders that can be easily embedded directly within such packages. In view of the ever-increasing need to reduce costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a heat spreader frame including: heat spreaders having upper surfaces; a peripheral frame surrounding the heat spreaders; spreaders, the peripheral frame having stand-off legs; tie bars having upper surfaces and a pin identifier at an end portion of the tie bars, the heat spreaders connected to one another and to the peripheral frame by the tie bars, the width of the stand-off legs wider than widths of the tie bars; at least portions of the upper surfaces of the tie bars being thinned to reduce heights of the tie bars; the upper surfaces of the heat spreader in an elevated position supported by the peripheral frame; and the heat spreaders and the tie bars covered by a package molding compound exposing the upper surface of the heat spreaders and one surface of the pin identifier coplanar to the upper surfaces of the heat spreaders.

The invention thus provides a cost-effective and readily manufacturable means to produce heat spreaders for small, die-sized IC packages, and to produce heat spreaders that can be embedded directly within such packages.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a top view of a heat spreader frame designed using leadframe technology in accordance with the present invention;

FIG. 2 is a cross-sectional view of the structure of FIG. 1 taken along line 2-2 in FIG. 1;

FIG. 3 is a top view of a package incorporating a heat spreader formed from the frame illustrated in FIG. 1;

FIG. 4 is a side view of the structure of FIG. 3 taken along view line 4-4 of FIG. 3;

FIG. 5 is a cross-sectional view of the structure of FIG. 3 taken along line 5-5 in FIG. 3;

FIG. 6 is a top view of a heat spreader frame designed using leadframe technology in accordance with another embodiment of the present invention;

FIG. 7 is a cross-sectional view of a portion of the structure of FIG. 6 taken along line 7-7 in FIG. 6;

FIG. 8 is a top view of a package incorporating a heat spreader formed from the frame illustrated in FIG. 6;

FIG. 9 is a side view of the structure of FIG. 8 taken along view line 9-9 of FIG. 8;

FIG. 10 is a cross-sectional view of the structure of FIG. 8 taken along line 10-10 in FIG. 8.

FIG. 11 is a top view of a heat spreader frame designed using leadframe technology in accordance with another embodiment of the present invention;

FIG. 12 is a cross-sectional view of a portion of the structure of FIG. 11 taken along line 12-12 in FIG. 11;

FIG. 13 is a top view of a package incorporating a heat spreader formed from the frame illustrated in FIG. 11;

FIG. 14 is a side view of the structure of FIG. 13 taken along view line 14-14 of FIG. 13;

FIG. 15 is a view similar to the view of FIG. 13 of a similar structure having a variation on the pin 1 identifier.

BEST MODE FOR CARRYING OUT THE INVENTION

Figure 16:
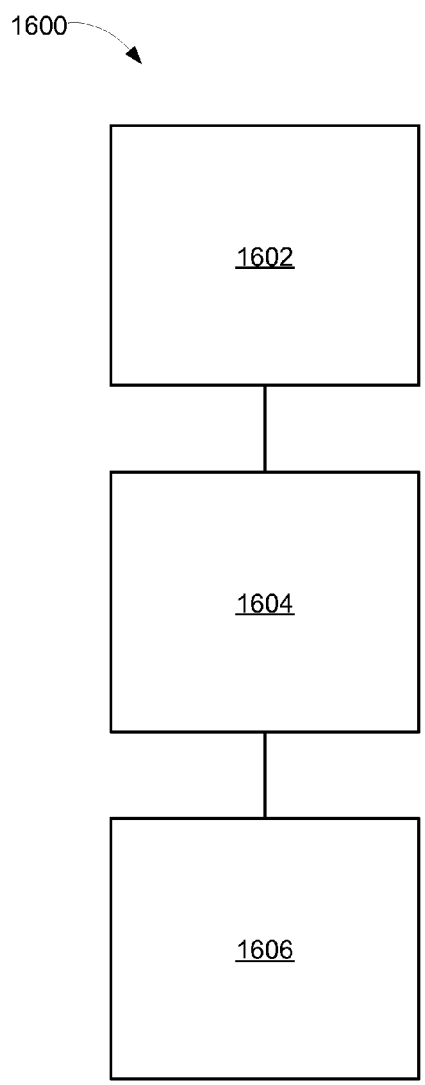
FIG. 16 is a flow chart of a method for fabricating a heat spreader in accordance with the present invention.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Likewise, the drawings showing embodiments of the invention are semi-diagrammatic and not to scale and, particularly, some of the dimensions are for the clarity of presentation and are shown exaggerated in the FIGs. Also, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of the heat spreader and any semiconductor die supported thereon, regardless of its orientation. The term "vertical" refers to a direction perpendicular to the horizontal as just defined. Terms, such as "on", "above", "below", "bottom", "top", "side"(as in "sidewall"), "higher", "lower", "upper", "over", and "under", are defined with respect to the horizontal plane.

Referring now to FIG. 1, therein is shown a top view of a heat spreader frame 100 designed using leadframe technology in accordance with the present invention and particularly well adapted for incorporation into a mold array package ("MAP"). More particularly, the embodiment of the heat spreader frame 100 illustrated in FIG. 1 is adapted and configured for incorporation into a 2×2 MAP molded package. The heat spreader frame 100 then provides four individual heat spreaders 102, one for each package. The packages, upon completion of the formation and molding thereof, are then separated or singulated from each other along singulation lines 104.

The heat spreaders 102 are connected to one another and supported by a plurality of tie bars 106 that are spaced from one another. The tie bars 106 also connect the heat spreaders 102 to a peripheral frame 108 that extends around the periphery of the heat spreader frame 100. The peripheral frame 108 includes stand-off legs 110 that are shaped and formed with a height to provide a height that supports and elevates the heat spreaders 102 and tie bars 106 in the top of a mold cavity when the heat spreaders are being molded in a mold into the integrated circuit ("IC") package (not shown, but see the package 300 in FIGS. 3-5). Preferably, the height (distance from bottom to top) of the stand-off legs 110 is in fact slightly greater than the depth (distance from bottom to top) of such a mold cavity that has been configured for receiving the heat spreaders therein. This ensures that the upper surfaces 112 of the heat spreaders 102 and tie bars 106 will be supported in an elevated position with respect to the bottom horizontal portion of the peripheral frame 108 in the very top of the mold cavity so that they are externally exposed on the top surfaces of the resulting packages following molding thereof.

Portions of the upper surfaces 114 of the tie bars 106 are partially thinned, as by etching, so that, upon molding, they are beneath the surface of the package (not shown, but see the package 300 in FIGS. 3-5). This results in thinned portions of the tie bars 106 or thinned, reduced height tie bar etched regions 116 that are formed on the upper surfaces 114 of the tie bars 106 at least on and within the boundaries of the singulation lines 104, between and elevated among the heat spreaders 102 above the bottom horizontal portion of the peripheral frame 108. Configuring the tie bar etched regions 116 on the upper surfaces 114 to be located beneath a package molding compound (not shown, but see the package molding compound 302 in FIGS. 3-5) assists in holding and locking the heat spreaders 102 in position in the package. The tie bar etched regions 116 on the upper surfaces 114, by virtue of being thinner in cross-section, are also easier to singulate, as by saw singulation. This results in an improved, precise singulation with less probability of singulation damage.

Based on the disclosures of the embodiments of the present invention, the dimensions of the tie bars 106, the depth of the tie bar etched regions 116 on the upper surfaces 114, and the size of the heat spreaders 102 are optimized both for manufacturability and for maximum thermal performance, according to the particular configuration at hand. Thus, the number of the tie bars 106, their dimensions and position locations, and the depth of the tie bar etched regions 116 on the upper surfaces 114, are selected to optimize the flow of the molding compound thereinaround during formation and molding of the packages, while still assuring that the heat spreaders 102 are supported in their correct positions during such molding, and are subsequently locked into the packages. Enhancements to assist mold flow may also be afforded, for example, by openings 118 through the stand-off legs 110. Each of the stand-off legs 110 has a wider width than widths the tie bars 106.

Referring now to FIG. 2, therein is shown a cross-sectional view 200 of the heat spreader frame 100 taken on line 2-2 therein.

Referring now to FIG. 3, therein is shown a top view of a package 300 incorporating one of the heat spreaders 102 formed from the heat spreader frame 100 (FIG. 1), following molding and singulation of the package 300. As can be seen, the heat spreader 102 is exposed on the top surface of the package molding compound 302, while the tie bar etched regions 116 on the upper surfaces 114 are beneath the surface thereof. A pin 1 identifier 304 may be provided on one of the tie bars 106, for example, by extending the tie bar etched region slightly into the upper surface 112 of the heat spreader 102. Such a pin 1 identifier, shown here as a semicircle, would be of assistance in orienting the package 300 and identifying the proper electrical connections thereto.

Referring now to FIG. 4, therein is shown a side view of the package 300, taken on view line 4-4 in FIG. 3.

Referring now to FIG. 5, therein is shown a cross-sectional view of the package 300 taken on cross-sectional line 5-5 in FIG. 3. As illustrated, the package 300 incorporates a substrate 500 therein on which is mounted an IC 502 that is electrically connected to the substrate 500 by bonding wires 504. The heat spreader 102 is positioned immediately above the IC 502 to conduct heat quickly and efficiently out through the top surface of the package 300. The package 300, which is essentially die-sized inasmuch as it is not much larger than the IC 502, is provided with a ball grid array ("BGA") 506 on the bottom thereof to connect electrically to other circuit devices (not shown) in known fashion.

Referring now to FIG. 6, therein is shown a top view of another embodiment of a heat spreader frame 600 designed using leadframe technology in accordance with the present invention and particularly well adapted for incorporation into a mold array package ("MAP"). More particularly, the embodiment of the heat spreader frame 600 illustrated in FIG. 6 is adapted and configured for incorporation into a 2×2 MAP molded package. The heat spreader frame 600 then provides four individual heat spreaders 602, one for each package. The packages, upon completion of the formation and molding thereof, are then separated or singulated from each other along singulation lines 604.

The heat spreaders 602 are connected to one another and supported by a plurality of tie bars 606 that are spaced from one another. The tie bars 606 also connect the heat spreaders 602 to a peripheral frame 608 that extends around the periphery of the heat spreader frame 600. The peripheral frame 608 includes stand-off legs 610 that are similar to the stand-off legs 110 (FIG. 1). Thus, the stand-off legs 610 are also shaped and formed with a height to provide a height that supports and elevates the heat spreaders 602 in the top of the mold cavity when the heat spreaders are being molded into the IC package (not shown, but see the package 800 in FIGS. 8-10). Preferably, the height of the stand-off legs 610 is in fact slightly greater than the depth of such a mold cavity that has been configured for receiving the heat spreaders therein. This ensures that the upper surfaces 612 of the heat spreaders 602 will be supported in an elevated position with respect to the peripheral frame 608 in the very top of the mold cavity so that they are externally exposed on the top surfaces of the resulting packages following molding thereof.

Portions of the upper surfaces 614 of the tie bars 606 are partially thinned, as by etching, so that, upon molding, they are beneath the surface of the package (not shown, but see the package 800 in FIGS. 8-10). This results in thinned, reduced height tie bar etched regions 616 that are formed on the upper surfaces 614 of the tie bars 606 at least on and within the boundaries of the singulation lines 604, between and among the heat spreaders 602 and the peripheral frame 608. Configuring the tie bar etched regions 616 on the upper surfaces 614 to be located beneath the package molding compound (not shown, but see the package molding compound 802 in FIGS. 8-10) assists in holding and locking the heat spreaders 602 in position in the package. The tie bar etched regions 616 on the upper surfaces 614, by virtue of being thinner in cross-section, are also easier to singulate, as by saw singulation. This results in an improved, precise singulation with less probability of singulation damage.

Based on the disclosures of the embodiments of the present invention, the dimensions of the tie bars 606, the depth of the tie bar etched regions 616 on the upper surfaces 614, and the size of the heat spreaders 602 are optimized both for manufacturability and for maximum thermal performance, according to the particular configuration at hand. Thus, the number of the tie bars 606, their dimensions and position locations, and the depth of the tie bar etched regions 616 on the upper surfaces 614, are selected to optimize the flow of the package molding compound therearound during formation and molding of the packages, while still assuring that the heat spreaders 602 are supported in their correct positions during such molding, and are subsequently locked into the packages. Enhancements to assist mold flow may also be afforded, for example, by openings 618 through the stand-off legs 610.

A ground connection leg 620 is attached to each heat spreader 602 at each corner thereof, and extends downwardly to a foot 622 at the end thereof opposite the heat spreader 602. The ground connection legs 620, including the respective feet thereon, provide for grounding the heat spreaders 602 to their respective substrates (not shown, but see the substrate 1000 in FIG. 10) by connection to suitable metallic grounding pads (not shown) thereon. In one embodiment, the ground connection is then provided using an electrically conductive adhesive between each of the feet 622 and the metallic grounding pads on the substrates, prior to molding of the packages (not shown, but see the package 800 in FIGS. 8-10).

The ground connection legs 620, which extend downwardly from the heat spreaders 602 to the height of the peripheral frame 608, also help to provide a stable stand-off for each of the heat spreaders 602 during molding of the package.

In this embodiment the ground connection legs 620 are positioned in the corners of the heat spreaders 602 to leave room for bonding wires (not shown, but see the bonding wires 1004 in FIG. 10). However, it will be understood that the ground connection legs 620 may be positioned elsewhere according to the particular needs and preferences that may be at hand.

It will also be understood that the size of the ground connection legs 620 and the surface area of the feet 622 will be selected for good electrical contact and good mechanical coupling to the substrate 1000 (FIG. 10). Alternatively, the feet 622 may be omitted when no electrical connection is needed and the legs are employed simply to provide additional mechanical stability and robustness for holding the heat spreaders 602 in position during molding of the packages 800 (FIGS. 8-10).

Referring now to FIG. 7, therein is shown a cross-sectional view 700 of a portion of the heat spreader frame 600 taken on line 7-7 in FIG. 6.

Referring now to FIG. 8, therein is shown a top view of a package 800 incorporating one of the heat spreaders 602 formed from the heat spreader frame 600 (FIG. 6), following molding and singulation of the package 800. As can be seen, the heat spreader 602 is exposed on the top surface of the package molding compound 802, while the tie bar etched regions 616 on the upper surfaces 614 are beneath the surface thereof. A pin 1 identifier 804 may be provided on one of the tie bars 606, for example, by extending the tie bar etched region slightly into the upper surface 612 of the heat spreader 602. Such a pin 1 identifier, shown here as a semicircle, would be of assistance in orienting the package 800 and identifying the proper electrical connections thereto.

Referring now to FIG. 9, therein is shown a side view of the package 800, taken on view line 9-9 in FIG. 8.

Referring now to FIG. 10, therein is shown a cross-sectional view of the package 800 taken on cross-sectional line 10-10 in FIG. 8. As illustrated, the package 800 incorporates a substrate 1000 therein on which is mounted an IC 1002 that is electrically connected to the substrate 1000 by bonding wires 1004. The heat spreader 602 is positioned immediately above the IC 1002 to conduct heat quickly and efficiently out through the top surface of the package 800. The package 800, which is essentially die-sized inasmuch as it is not much larger than the IC 1002, is provided with a BGA 1006 on the bottom thereof to connect electrically to other circuit devices (not shown) in known fashion.

Referring now to FIG. 11, therein is shown a top view of another embodiment of a heat spreader frame 1100 designed using leadframe technology in accordance with the present invention and particularly well adapted for incorporation into a mold array package ("MAP"). More particularly, the embodiment of the heat spreader frame 1100 illustrated in FIG. 11 is adapted and configured for incorporation into a 2×2 MAP molded package. The heat spreader frame 1100 then provides four individual heat spreaders 1102, one for each package. The packages, upon completion of the formation and molding thereof, are then separated or singulated from each other along singulation lines 1104.

The heat spreaders 1102 are connected to one another and supported by a plurality of tie bars 1106 that are spaced from one another. The tie bars 1106 also connect the heat spreaders 1102 to a peripheral frame 1108 that extends around the periphery of the heat spreader frame 1100. The peripheral frame 1108 includes stand-off legs 1110 that are similar to the stand-off legs 110 (FIG. 1). Thus, the stand-off legs 1110 are also shaped and formed with a height to provide a height that supports and elevates the heat spreaders 1102 in the top of the mold cavity when the heat spreaders are being molded into the IC package (not shown, but see the package 1300 in FIGS. 13-14). Preferably, the height of the stand-off legs 1110 is in fact slightly greater than the depth of such a mold cavity that has been configured for receiving the heat spreaders therein. This ensures that the upper surfaces 1112 of the heat spreaders 1102 will be supported in an elevated position with respect to the peripheral frame 1108 in the very top of the mold cavity so that they are externally exposed on the top surfaces of the resulting packages following molding thereof.

Portions of the upper surfaces 1114 of the tie bars 1106 are partially thinned, as by etching, so that, upon molding, they are beneath the surface of the package (not shown, but see the package 1300 in FIGS. 13-14). This results in thinned, reduced height tie bar etched regions 1116 that are formed on the upper surfaces 1114 of the tie bars 1106 at least on and within the boundaries of the singulation lines 1104, between and among the heat spreaders 1102 and the peripheral frame 1108. Configuring the tie bar etched regions 1116 on the upper surfaces 1114 to be located beneath the package molding compound (not shown, but see the package molding compound 1302 in FIGS. 13-15) assists in holding and locking the heat spreaders 1102 in position in the package. The tie bar etched regions 1116 on the upper surfaces 1114, by virtue of being thinner in cross-section, are also easier to singulate, as by saw singulation. This results in an improved, precise singulation with less probability of singulation damage.

Based on the disclosures of the embodiments of the present invention, the dimensions of the tie bars 1106, the depth of the tie bar etched regions 1116 on the upper surfaces 1114, and the size of the heat spreaders 1102 are optimized both for manufacturability and for maximum thermal performance, according to the particular configuration at hand. Thus, the number of the tie bars 1106, their dimensions and position locations, and the depth of the tie bar etched regions 1116 on the upper surfaces 1114, are selected to optimize the flow of the package molding compound therearound during formation and molding of the packages, while still assuring that the heat spreaders 1102 are supported in their correct positions during such molding, and are subsequently locked into the packages. Enhancements to assist mold flow may also be afforded, for example, by openings 1118 through the stand-off legs 1110.

Ground connection legs 1120 are attached to each heat spreader 1102 along the sides thereof, and extend downwardly to a foot 1122 at the end thereof opposite the heat spreader 1102. The ground connection legs 1120, including the respective feet thereon, provide for grounding the heat spreaders 1102 to their respective substrates (not shown, but see the substrate 1400 in FIG. 14) by connection to suitable metallic grounding pads (not shown) thereon. In one embodiment, the ground connection is then provided using an electrically conductive adhesive between each of the feet 1122 and the metallic grounding pads on the substrates, prior to molding of the packages (not shown, but see the package 1300 in FIGS. 13 and 14).

It will be understood that the size of the ground connection legs 1120 and the surface area of the feet 1122 will be selected for good electrical contact and good mechanical coupling to the substrate. Alternatively, the feet 1122 may be omitted when no electrical connection is needed and the legs are employed simply to provide additional mechanical stability and robustness for holding the heat spreaders 1102 in position during molding of the packages 1300 (FIGS. 13-14). In this regard, the ground connection legs 1120, which extend downwardly from the heat spreaders 1102 to the height of the peripheral frame 1108, also help to provide a stable stand-off for each of the heat spreaders 1102 during molding of the package.

As can be seen in FIG. 11, the ground connection legs 1120 extend from the sides of the heat spreaders 1102. Although the ground connection legs 1120 are positioned along the sides of the heat spreaders 1102, it will be understood that the ground connection legs 1120 may be positioned elsewhere according to the particular needs and preferences that may be at hand.

As can also be seen in FIG. 11, the tie bars 1106 extend from the corners of the heat spreaders 1102. The ends of the tie bars 1106 are shaped as enlarged heads 1124 to provide additional locking strength at the corners of the packages in order to lock and secure the heat spreaders 1102 therein.

Referring now to FIG. 12, therein is shown a cross-sectional view 1200 of a portion of the heat spreader frame 1100 taken on line 12-12 in FIG. 11.

Referring now to FIG. 13, therein is shown a top view of a package 1300 incorporating one of the heat spreaders 1102 formed from the heat spreader frame 1100 (FIG. 11), following molding and singulation of the package 1300. As can be seen, the heat spreader 1102 is exposed on the top surface of the package molding compound 1302, while the tie bar etched regions 1116 on the upper surfaces 1114 and the enlarged heads 1124 on the ends thereof are beneath the surface of the package 1300.

A pin 1 identifier 1304 may optionally be provided by leaving one of the enlarged heads 1124 unetched so that its full height extends to the top surface of the package 1300. Such a pin 1 identifier would be of assistance in orienting the package 1300 and identifying the proper electrical connections thereto.

Referring now to FIG. 14, therein is shown a side view of the package 1300, taken on view line 14-14 in FIG. 13. A substrate 1400 on the bottom surface of the package 1300 is provided with a BGA 1402 on the bottom thereof to connect electrically to other circuit devices (not shown) in known fashion.

Referring now to FIG. 15, therein is shown a view similar to the view of FIG. 13 of a package 1500 similar to the package 1300 (FIG. 13), but having a variation on the pin 1 identifier. In the package 1500, a pin 1 identifier 1502 is provided by forming a circular button on the top of one of the tie bars 1106 as an unetched circular post thereon extending to the top surface of the package 1500.

Referring now to FIG. 16, therein is shown a flow chart of a method 1600 for fabricating a heat spreader in accordance with the present invention. The method 1600 includes forming, as by an etching or stamping process, heat spreaders surrounded by a frame and connected to one another and to the frame by tie bars, the heat spreaders and tie bars having respective upper surfaces, in a block 1602; thinning at least portions of the upper surfaces of the tie bars to reduce the heights of the tie bars at least on a singulation line thereon in a block 1604; and forming the frame to support the heat spreader upper surfaces in an elevated position with respect thereto in a block 1606.

In one embodiment, the invention thus makes it readily possible to provide each MAP mold cap with its own heat spreader. The heat spreaders may be fabricated, for example, of a leadframe alloy and plated at least on the external surface with tin, nickel, or another suitable alloy to enable package marking. The thicknesses of the heat spreaders, tie bars, and so forth will be optimized for the thermal performance, cost, saw singulation, and other parameters of the particular configuration and application at hand. In one embodiment for example, the heat spreader frame thickness was approximately 200 μm.

To deter mold flashing, the heat spreaders may optionally be taped, with the tape being peeled off after the molding. Alternatively, the molding may use a film-assisted molding process.

The invention thus improves thermal and electrical performance by providing an inexpensive, compact, cost-effective, reliable, and readily manufacturable heat spreader that can be easily adapted for different die-sized IC package configurations and dimensions. It locks the heat spreaders into the IC packages and affords easy saw singulation without materially increasing the risk of tearing the packages or tearing the heat spreader components that are molded therein. Additional features, such as the pin 1 identifiers, can be incorporated at virtually no additional cost.

Thus, it has been discovered that the leadframe-based mold array package heat spreader and fabrication method of the present invention furnish important and heretofore unknown and unavailable solutions, capabilities, and functional advantages for facilitating heat removal from small, die-sized IC packages in which the semiconductor die is nearly the same size as the IC package itself. The resulting configurations and processes are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A heat spreader frame comprising:
   heat spreaders having upper surfaces;
   a peripheral frame surrounding the heat spreaders; spreaders, the peripheral frame having stand-off legs;
   tie bars having upper surfaces and a pin identifier at an end portion of the tie bars, the heat spreaders connected to one another and to the peripheral frame by the tie bars, the width of the stand-off legs wider than widths of the tie bars;
   at least portions of the upper surfaces of the tie bars being thinned to reduce heights of the tie bars;
   the upper surfaces of the heat spreader in an elevated position supported by the peripheral frame; and
   the heat spreaders and the tie bars covered by a package molding compound exposing the upper surface of the heat spreaders and one surface of the pin identifier coplanar to the upper surfaces of the heat spreaders.

2. The heat spreader frame of claim 1 wherein the peripheral frame is formed to support the heat spreader upper surfaces in an elevated position with respect thereto with a height greater than a predetermined depth of a mold cavity of the package molding compound configured for receiving the heat spreaders therein.

3. The heat spreader frame of claim 1 wherein the peripheral frame includes openings in the peripheral frame to facilitate mold flow therethrough.

4. The heat spreader frame of claim 1 further comprising ground connection legs extended downwardly from the heat spreaders.

5. The heat spreader frame of claim 1 further comprising a pin 1 identifier of one the tie bars on the one of the tie bars.

6. A heat spreader frame comprising:
   a plurality of heat spreaders;
   a peripheral frame surrounding the heat spreaders having stand-off legs;
   a plurality of tie bars spaced from one another, the plurality of the tie bars connect the heat spreaders to one another and to the peripheral frame having an end portion of one of the tie bars as a pin identifier, a width of the stand-off legs wider than widths of the tie bars, and ends of the tie bars are shaped as enlarged heads;
   the peripheral frame formed with a height to support the heat spreaders in an elevated position with respect thereto; and
   a package molding compound encapsulating the heat spreaders, tie bars, and the peripheral frame, the upper surface of the heat spreaders and one surface of the pin identifier coplanar to the upper surfaces of the heat spreaders exposed from the package molding compound.

7. The heat spreader frame of claim 6 wherein the peripheral frame is formed to support heat spreader upper surfaces of the heat spreaders in an elevated position with respect thereto with a height greater than the predetermined depth of a mold cavity of the package molding compound configured for receiving the heat spreaders therein.

8. The heat spreader frame of claim 6 wherein the peripheral frame includes openings in the peripheral frame to facilitate mold flow therethrough.

9. The heat spreader frame of claim 6 further comprising a plurality of ground connection legs extended downwardly from the heat spreaders to the height of the peripheral frame.

10. The heat spreader frame of claim 6 further comprising a pin 1 identifier of one of the tie bars on the one of the tie bars, and wherein the heat spreaders are plated with tin or nickel.

11. An integrated circuit package comprising:
a heat spreader having an upper surface;
a tie bar connected to the heat spreader, at least portions of an upper surface of the tie bar being thinned to reduce a height thereof, and an end portion of the tie bar for serving as a pin identifier; and
a package molding compound surrounding the heat spreader and the tie bar, the upper surface of the heat spreader and one surface of the pin identifier coplanar to the upper surface of the heat spreader exposed from the package molding compound.

\* \* \* \* \*